United States Patent
Klee et al.

(10) Patent No.: US 7,985,676 B2
(45) Date of Patent: Jul. 26, 2011

(54) METHOD OF MAKING A CONTACT IN A SEMICONDUCTOR DEVICE

(75) Inventors: Veit Klee, Pleasant Valley, NY (US);
Roman Knoefler, Fishkill, NY (US);
Uwe Paul Schroeder, Lake Carmel, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 12/693,231

(22) Filed: Jan. 25, 2010

(65) Prior Publication Data

US 2010/0124820 A1    May 20, 2010

Related U.S. Application Data

(62) Division of application No. 11/301,515, filed on Dec. 13, 2005, now Pat. No. 7,678,704.

(51) Int. Cl.
*H01L 21/4763* (2006.01)

(52) U.S. Cl. ........ 438/637; 438/636; 438/692; 438/736; 257/E21.585

(58) Field of Classification Search .............. 438/636, 438/637, 692, 735, 736, 738, 739, 761, 763; 257/E21.585
See application file for complete search history.

(56) References Cited

U.S. PATENT DOCUMENTS

| | | | |
|---|---|---|---|
| 4,470,189 A | 9/1984 | Roberts et al. | |
| 4,799,990 A | 1/1989 | Kerbaugh et al. | |
| 5,024,971 A * | 6/1991 | Baker et al. | 438/586 |
| 5,510,216 A * | 4/1996 | Calabrese et al. | 430/16 |
| 5,834,159 A | 11/1998 | Stolmeijer | |
| 6,177,304 B1 * | 1/2001 | Li et al. | 438/233 |
| 6,221,777 B1 | 4/2001 | Singh et al. | |
| 6,277,544 B1 | 8/2001 | Singh et al. | |
| 6,376,298 B1 | 4/2002 | Li et al. | |
| 6,448,140 B1 * | 9/2002 | Liaw | 438/279 |
| 6,867,116 B1 | 3/2005 | Chung | |
| 7,151,055 B2 | 12/2006 | Aminpur et al. | |
| 2002/0137350 A1 * | 9/2002 | Endoh et al. | 438/700 |
| 2005/0098091 A1 | 5/2005 | Babich et al. | |
| 2005/0221612 A1 | 10/2005 | Brown et al. | |
| 2006/0286793 A1 * | 12/2006 | Lin et al. | 438/637 |
| 2007/0054486 A1 | 3/2007 | Yang | |
| 2007/0141834 A1 * | 6/2007 | Kwon et al. | 438/637 |

FOREIGN PATENT DOCUMENTS

EP    0 288 739    11/1988

OTHER PUBLICATIONS

Kurihara, K., et al., "Electron beam nanolithography with image reversal by ECR plasma oxidation," Microelectronic Engineering, vol. 27 (1995), pp. 125-128, Elsevier Science B.V.

* cited by examiner

*Primary Examiner* — Matthew C Landau
*Assistant Examiner* — Colleen E Snow
(74) *Attorney, Agent, or Firm* — Slater & Matsil, L.L.P.

(57) ABSTRACT

To form a semiconductor device, an insulating layer is formed over a conductive region and a pattern transfer layer is formed over the insulating layer. The pattern transfer layer is patterned in the reverse tone of a layout of recesses to be formed in the insulating layer such that the pattern transfer layer remains over regions where the recesses are to be formed. A mask material is formed over the insulating layer and is aligned with the pattern transfer layer. Remaining portions of the pattern transfer layer are removed and recesses are etched in the insulating layer using the mask material as a mask.

22 Claims, 11 Drawing Sheets

METHOD OF MAKING A CONTACT IN A SEMICONDUCTOR DEVICE

This is a divisional application of U.S. application Ser. No. 11/301,515, which was filed on Dec. 13, 2005 now U.S. Pat. No. 7,678,704 and is incorporated herein by reference.

TECHNICAL FIELD

This invention relates generally to semiconductor devices, and more particularly to a method of making a contact in a semiconductor device.

BACKGROUND

Semiconductors are widely used for integrated circuits for electronic applications, including computers, radios, and televisions, as examples. Such integrated circuits typically use multiple transistors fabricated in single crystal silicon. It is common for there to be millions of semiconductor devices on a single semiconductor product. To provide the necessary signal and power interconnections for the multiplicity of semiconductor devices, many integrated circuits now include multiple levels of metallization.

The semiconductor industry continuously strives to decrease the size of the semiconductor devices located on integrated circuits. Miniaturization is generally needed to accommodate the increasing density of the circuits necessary for today's advanced semiconductor products. One of the areas where miniaturization is needed is in forming the contacts between conductors in an integrated circuit.

In the present technology, contact holes are made in a dielectric that overlies the semiconductor substrate. These contact holes are made using a photolithographic process. For example, after the transistors are formed, a pre-metal dielectric (PMD) is deposited over the substrate. An antireflective coating (ARC) can then be deposited over the pre-metal dielectric and a photoresist applied. Radiation is directed toward the photoresist through a mask so that selected portions of the photoresist are irradiated. Portions of the resist, and underlying ARC, can then be removed to expose portions of the interlevel dielectric. These portions can be anisotropically etched to create the contact holes.

The contact holes are filled with a conductor to create a plug. For example, a liner such as titanium followed by titanium nitride is formed along sidewalls of the contact hole. The hole can then be filled with a conductor such as tungsten. The tungsten can then be removed to the level of the pre-metal dielectric using a chemical mechanical polish or etch back process.

SUMMARY OF THE INVENTION

In one embodiment, a semiconductor device is formed. An insulating layer is formed over a conductive region and a pattern transfer layer is formed over the insulating layer. The pattern transfer layer is patterned in the reverse tone of a layout of recesses to be formed in the insulating layer such that the pattern transfer layer remains over regions where the recesses are to be formed. A mask material is formed over the insulating layer and is aligned with the pattern transfer layer. Remaining portions of the pattern transfer layer are removed and recesses are etched in the insulating layer using the mask material as a mask.

The details of one or more embodiments of the invention are set forth in the accompanying drawings and the description below. Various features and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 6b shows a plan view of the structure according to FIG. 6a; and

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a contact hole for a plug in an integrated circuit. The invention may also be applied, however, to other processes that require a contact hole. For example, concepts of the invention can be applied to the formation of via holes in the metallization layers. The present invention can also be used to form other recesses such as trenches in a damascene process.

In various embodiments, the present invention provides a method for forming small contact holes. As the technology nodes get smaller, current processes will become more and more difficult to implement. For example, as dimensions shrink to 45 nm and below, the lithography capabilities of printing the required tiny contact holes will be limited. It has been demonstrated that it is possible to print lines and resist islands smaller than 50 nm with sufficient process window.

In one aspect, the present invention takes the advantageous step to invert the lithography and mask process to not print holes but rather the spaces between the holes. In another aspect, the present invention provides novel integration schemes to re-invert the lithographically printed pattern.

Figure 1:
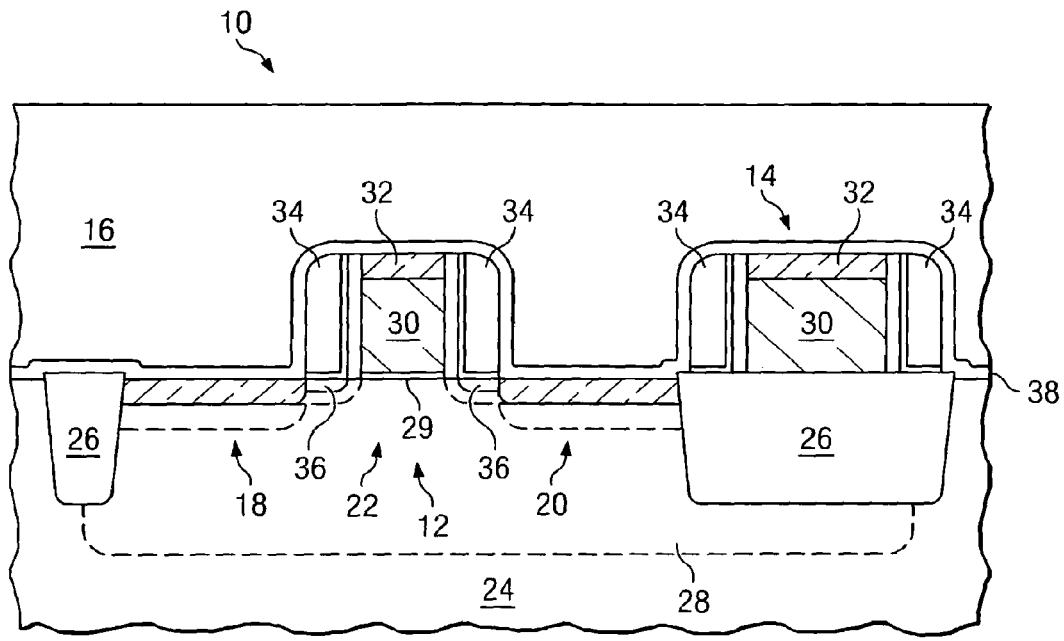
FIGS. 1-5, 6a, and 7-13 are cross-sectional diagrams showing various stages of fabrication of a semiconductor device using a first embodiment process.

Referring first to FIG. 1, a semiconductor structure 10 includes a conductive region, in this case a transistor 12 and an interconnect line 14, covered by an insulating layer 16. This particular structure is merely illustrative of one structure that can utilize aspects of the present invention. As will be discussed with respect to the following figures, contacts (labeled 54 and 56 in FIG. 13) will be formed to a first source/drain region 18 and the interconnect line 14. A butted contact (labeled 58 in FIG. 13) will also be formed between gate 22 and second source/drain region 20.

In the figure, the transistor 12 is formed in a semiconductor body 24. The semiconductor body 24 may be formed from a bulk semiconductor substrate, a layer (e.g., an epitaxial layer) overlying a substrate, or a region formed within a substrate or a layer. As an example, concepts of the present invention are very well suited for silicon-on-insulator applications where transistors are formed in a layer of semiconductor material that overlies an insulating layer (e.g., a buried oxide). The preferred semiconductor material is silicon. It is understood, however, that devices formed in other elemental semiconductors (e.g., germanium), alloy semiconductors (e.g., silicon germanium) or compound semiconductors (e.g., gallium arsenide) can also benefit from aspects of the present invention.

In the illustrated embodiment, the transistor 12 is formed in an active area defined by isolation regions 26. In the preferred embodiment, the isolation regions are shallow trench isolation (STI) regions. In other embodiments, the isolation can be provided using other techniques such as field isolation or deep trench isolation. In the preferred embodiment, the STI regions 26 extend less than about 1000 nm into the semiconductor body 24.

A well region 28 is formed in the active area. In an exemplary embodiment, the semiconductor body 24 can be a p-doped substrate. In this case, p-channel transistors would be formed in an n-well 28. In the example of a p-doped substrate, the n-channel transistors can be formed in the substrate (without a well) or, more preferably, in a p-well 28 formed in the substrate. In other embodiments, an n-doped semiconductor body 24 can be used with p-wells and optional n-wells. The well region 28 typically extends to a depth of about 1000 nm to 3000 nm.

The gate 22 is formed from a gate stack that overlies the semiconductor body 24. In the exemplary embodiment, the gate stack includes a gate dielectric 29, a composite layer gate conductor including polysilicon 30 and silicide 32. A hard mask, which is not shown, could also be included. To form the gate stack, a gate dielectric layer is deposited. A gate conductor layer(s) is deposited over the gate dielectric layer and a hard mask layer is deposited over the gate conductor layer. A photoresist layer (not shown) is formed over the hard mask layer and, using photolithography techniques, is patterned to cover the gate stack. The hard mask layer, which may be silicon nitride, can then be etched to form the hard mask (not shown). Using the hard mask as a mask, the gate layer(s) 30 (32) and possibly dielectric layer 29 are etched to create the desired gate structure.

The gate dielectric layer 29 can be an oxide layer such as silicon dioxide, a nitride layer such as silicon nitride ($Si_3N_4$), or a combination of oxide and nitride such as silicon oxynitride or multiple layers of oxides and nitrides. In other embodiments, the gate dielectric 29 can be a high-k dielectric (i.e., a dielectric with a dielectric constant greater than the dielectric constant of $Si_3N_4$). Examples of high-k dielectrics that can be used as a gate dielectric include $HfO_2$, (nitrided) Hf silicate, $Al_2O_3$, $ZrO_2$, Zr—Al—O, Zr silicate.

In the preferred embodiment, the gate conductor 30 includes two layers. For example, a silicide layer 32 can overlie a polysilicon layer 30. When a polysilicon gate 30 is used, it is often desirable to further include a metal to lower the resistance of the region. Examples of silicides that can be used for this layer include titanium silicide, tungsten silicide, cobalt silicide, platinum silicide and nickel silicide. In other embodiments, a metal gate can be used (e.g., a single or multiple layers of metal). The metal gate can be a metal (e.g., Ir, Ru, RuTa, HfN, Ti, TiN, TaSiN, Mo), a metal silicide (e.g., a fully silicided gate), a metal nitride or other.

Lightly doped source and drain regions 36 are formed in a self-aligned manner with respect to the gate stack. In the illustrated embodiment, the lightly doped source and drain regions 36, sometimes referred to as extension regions, are formed using two implantation steps. A first implantation can be performed followed by formation of a sidewall liner or spacer. Then a second implantation can be performed. In other embodiments, a single implantation or more than two implantations can be performed. For example, a halo implant can be performed.

Sidewall spacers 34 are formed along sidewalls of the gate stack 22. The sidewall spacers 34 can be formed by depositing a conformal layer of dielectric, such as silicon oxide or silicon nitride, and anisotropically etching the conformal layer to leave the spacers 34 along the sidewall. The simplified view of FIG. 1 shows only a single liner and spacer. It is understood, however, that this process can be repeated more than once to get a spacer of the desired thickness.

After formation of the sidewall spacers 34, the source/drain regions 18 and 20 can be formed. These regions can be formed by the implantation of dopants in a manner that is self-aligned with the sidewall spacers 34. In one embodiment, these regions are preferably formed using a two-implantation step, although more or fewer implantation steps can be used. In the case of a 45 nm node transistor, the two implantations will preferably form a doped region with a junction depth of about 50 nm to about 70 nm. This dimension can vary with other technology nodes.

In the preferred embodiment, the source/drain regions 18 and 20 are also silicided. In fact, in one embodiment the source/drain regions 18 and 20 and the gate polysilicon 30 can be silicided at the same time. In the case where interconnect line 14 is a polysilicon line, this feature can be silicided at this time as well. (If the polysilicon lines were silicided prior to gate patterning, these layers do not need to be silicided again.) In a preferred embodiment, a self-aligned silicide (sometimes referred to as a salicide) process is used. A metal layer can be deposited on the wafer and heated so that it will react with the silicon of the source/drain regions 18 and 20 and the polysilicon lines 30 and 14. Unreacted metal can then be removed.

In the illustrated embodiment, the interconnect line 14 overlies one of the isolation regions 26. This line is formed at the same time the gate conductor is formed. As a result, sidewall spacers 34 are formed along the sidewalls of the interconnect line 14. While these spacers are necessarily needed for fabrication of the device, it is more typically convenient to leave them there. The interconnect line 14 could be part of a gate of a transistor that lies either above or below the plane of the page. In one example, the semiconductor structure 10 can be a memory device and the gate 22 and interconnect line 14 can couple a number of memory cells along a row of an array (e.g., serve as a wordline conductor).

An insulating layer 38 is formed over the transistor 12 and interconnect line 14. In one example, the insulating layer 38 can serve as a contact etch stop. In one embodiment, this layer 38 can be formed in a manner that imposes a stress (either compressive or tensile) onto the transistor 12 to create a strained channel transistor. The strain will help increase the mobility of carriers. In a preferred embodiment, the layer 38 is formed from a nitride such as silicon nitride (e.g., $Si_3N_4$). In other embodiments, other materials can be used.

Insulating layer 16 is formed over the insulating layer 38. In one embodiment, the insulating layer 16 is formed from an oxide such as silicon dioxide. For example, an oxide layer, sometimes referred to as a TEOS layer, can be formed by the decomposition of tetraethyloxysilane (TEOS). In other embodiments, other deposition methods (e.g., high temperature oxide) can be used. The insulating layer can be a doped glass layer such as borophosphosilicate glass (BPSG), phosphosilicate glass (PSG), fluorinated silicon glass (FSG) or others.

Figure 2:
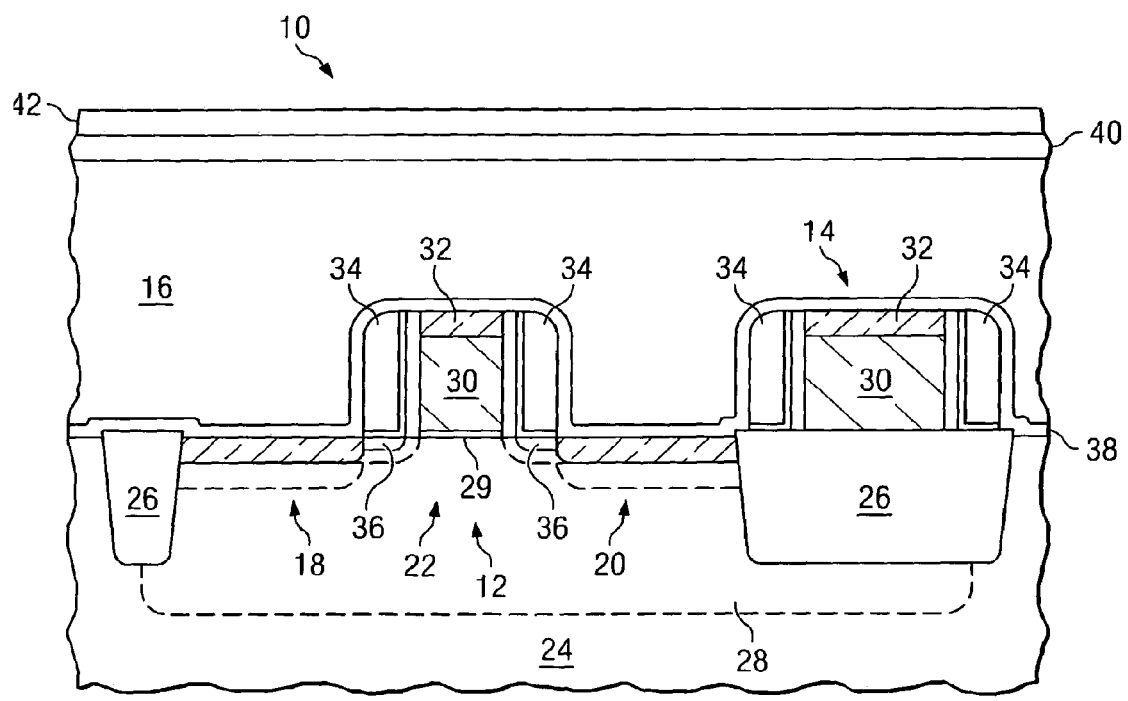

FIG. 2 shows the first process steps in the preferred embodiment of forming a contact. A masking layer 40 is formed over the insulating layer 16. In the preferred embodiment, the masking layer 40 is silicon, e.g., polysilicon or amorphous silicon. The layer can be doped or undoped. In other embodiments, other materials can be used. For example, the masking layer 40 can be any material that can change state or physical properties (in a way that allows a selective etch from the original state) when exposed to a process. As will be discussed below, the silicon can change state by reacting with a metal to form a silicide.

A pattern transfer layer or 42 is formed over the masking layer 40. The pattern transfer layer 42 will be patterned with the contact patterns (in reverse tone) and prevent underlying portions of the masking layer 40 from reacting during the selectivity generation process. In the preferred embodiment, the pattern transfer layer 42 is a silicon dioxide layer that is deposited by chemical vapor deposition. In another example, the underlying silicon layer 40 can be thermally oxidized. In this case, the silicon layer 40 should be thick enough to ensure that it is not fully oxidized. In other examples, the pattern transfer layer 42 can be another material such as silicon nitride, silicon oxynitride.

Figure 3:
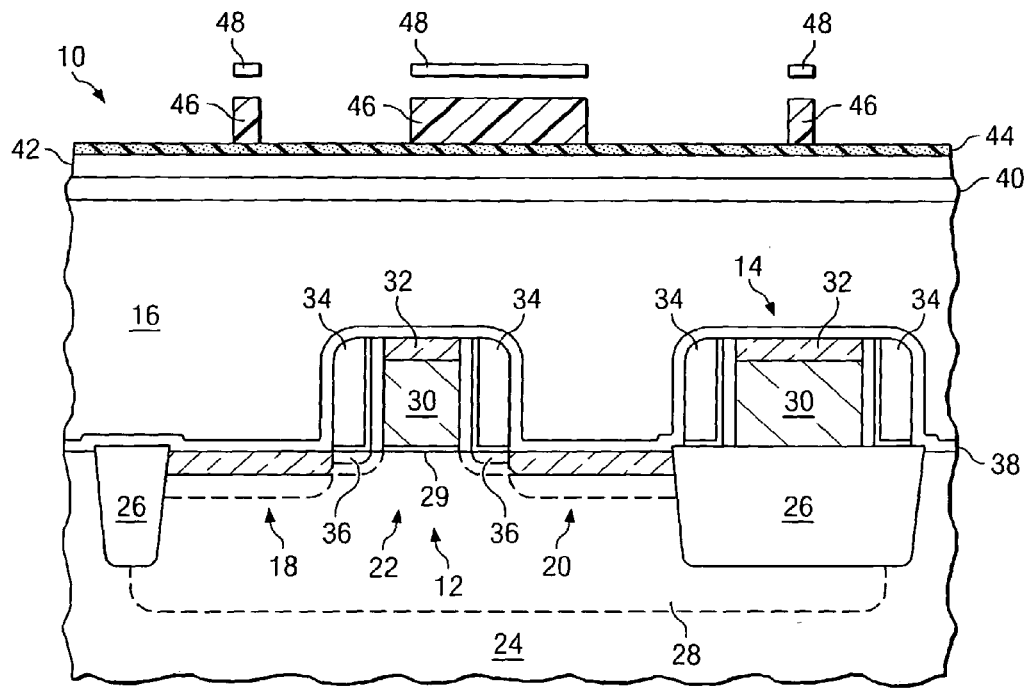

Referring next to FIG. 3, the lithography process can begin. As shown in FIG. 3, an optional antireflective coating (ARC) 44 is formed over the pattern transfer layer 42. The ARC 44 can be an organic material, either polyimide and non-polyimide based, or an inorganic material such as $SiO_xN_y$, TiN, $TaSi_2$, TiW, or amorphous silicon, as examples. This layer is included to enhance the lithography process.

A resist layer 46 is formed over the ARC 44. The resist layer 46 can be any photoresist used in a lithography system of the appropriate dimension. The resist material is typically tailored to work with a specified wavelength of radiation. This radiation will be applied to the resist through a mask 48. In this manner, the pattern of the contact holes can be formed.

In the preferred embodiment, the photoresist is patterned in a reverse pattern. In other words, islands of photoresist remain in the places where the contact holes will be formed. This is opposite from conventional lithography steps where the resist is removed wherever underlying material will be removed. One advantage of using the reverse pattern is that the spaces between contact holes are typically larger (often much larger) than the contact holes themselves. Consequently, the reverse pattern is easier to image.

Figure 4:
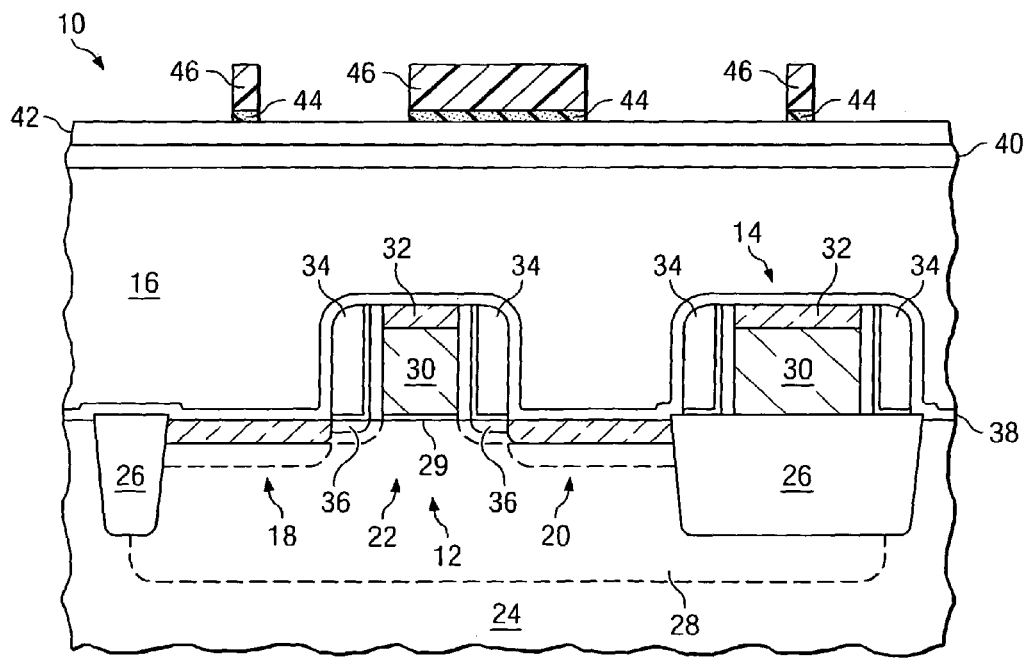

Referring to FIG. 4, the exposed portions of the ARC 44 are removed. At this point, the remaining resist islands 46 can be trimmed. Trimming is a process where the lateral dimensions of the resist are shortened so as to create a pattern that is smaller than what could have been printed via the mask. The trimming process is optional and not always necessary.

Figure 5:
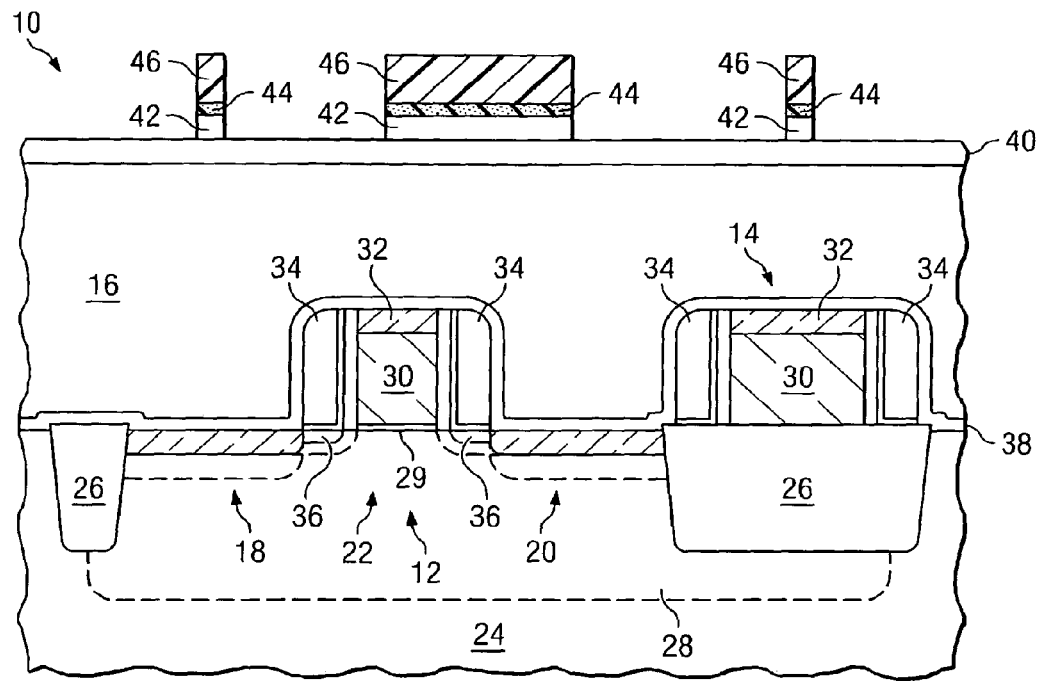

As shown in FIG. 5, the pattern transfer layer 42 is etched in alignment with the resist islands 46. During this process, portions of the pattern transfer layer 42 are removed to expose portions of the masking layer 40. Other portions of the pattern transfer layer 42 remain to overly portions of the insulating layer 16 in which contact holes will be formed. In the preferred embodiment, the exposed portions of the masking layer 40 can be processed so as to be selectively etchable with respect to the unexposed portions.

Figure 6A:
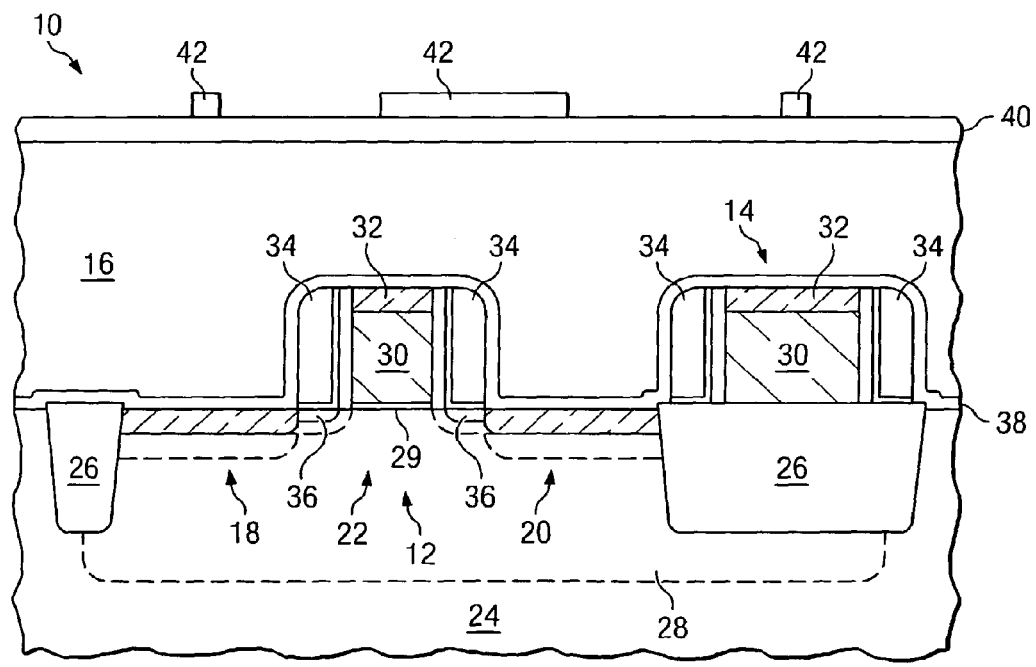
Figure 6B:
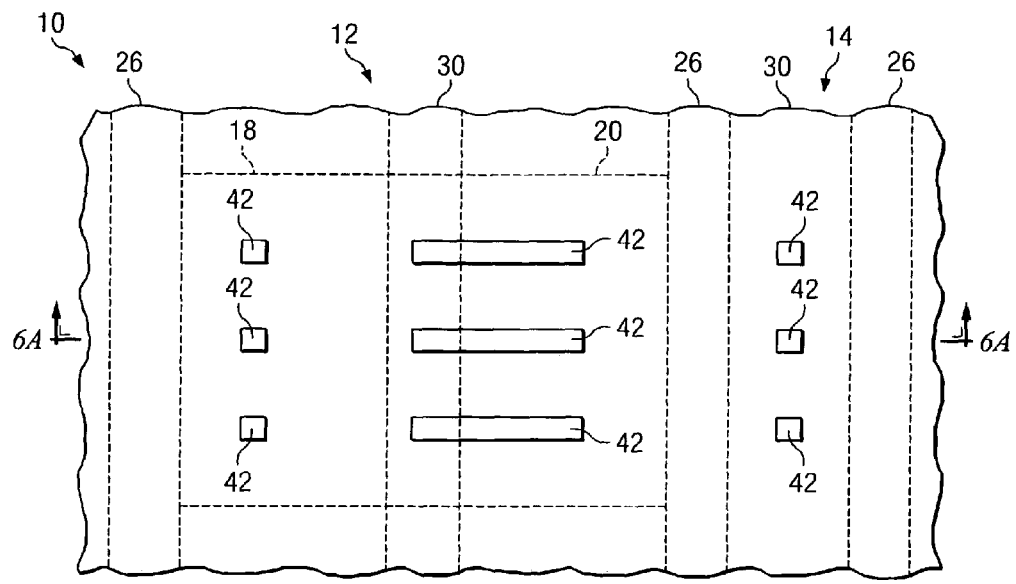

FIG. 6a illustrates a cross-section of the structure after removal of the resist 46 and the ARC 44. FIG. 6b is provided to show a simplified plan view of the resulting structure. In this view, the islands of the remaining portions of the pattern transfer layer 42 are shown over various portions of the underlying structure, namely source/drain regions 18 and 20, gate conductor 30 and interconnect line 14. For simplicity, the intermediate masking layer 40 is not shown. As discussed above, the islands 42 remain where the contacts will be formed.

Figure 7:
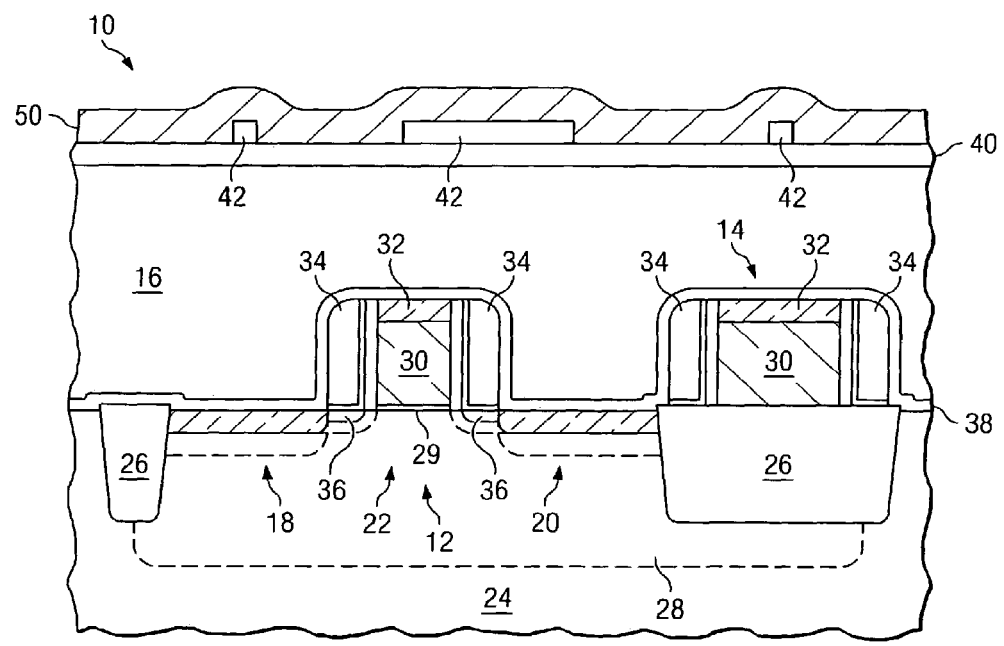
Figure 8:
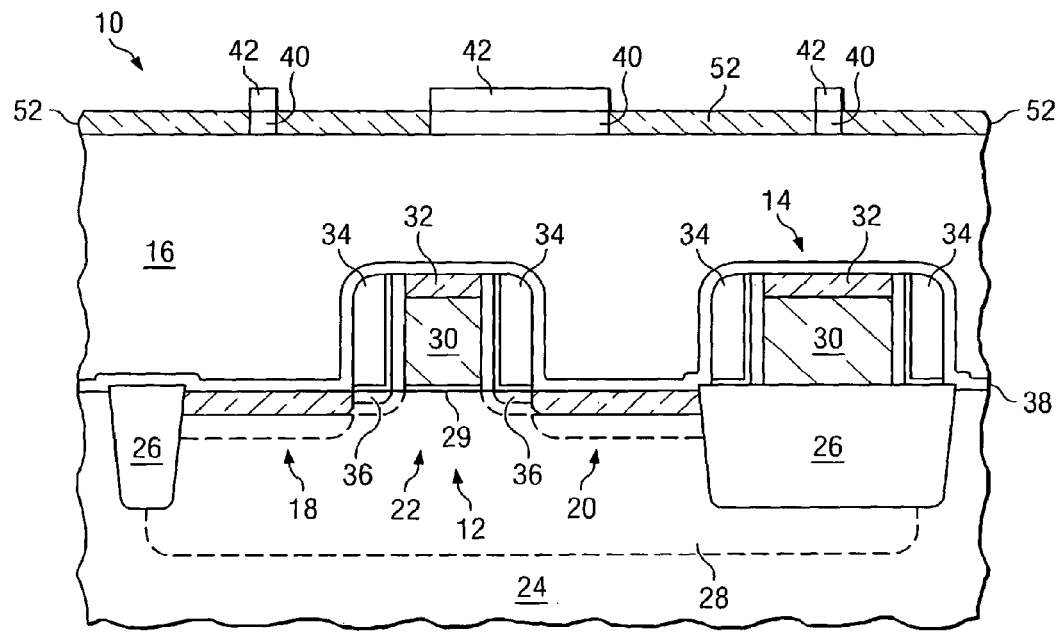

The exposed portions of the masking layer 40 can now be reacted so that the exposed portions are distinct from unexposed portions of the masking layer. FIGS. 7 and 8 illustrate the preferred method for accomplishing this task. In FIG. 7, a metal layer 50 is deposited over the structure. The metal is preferably a metal capable of reacting with silicon, e.g., to create a silicide. In the preferred embodiment, the metal layer 50 is a nickel layer. In other embodiments, other metals such as titanium, tungsten, cobalt, or platinum can be used. Although not necessary, it may be convenient to use the same material that was used to silicide the source/drain regions 18 and 20 and/or conductors 30 and 14.

Figure 9:
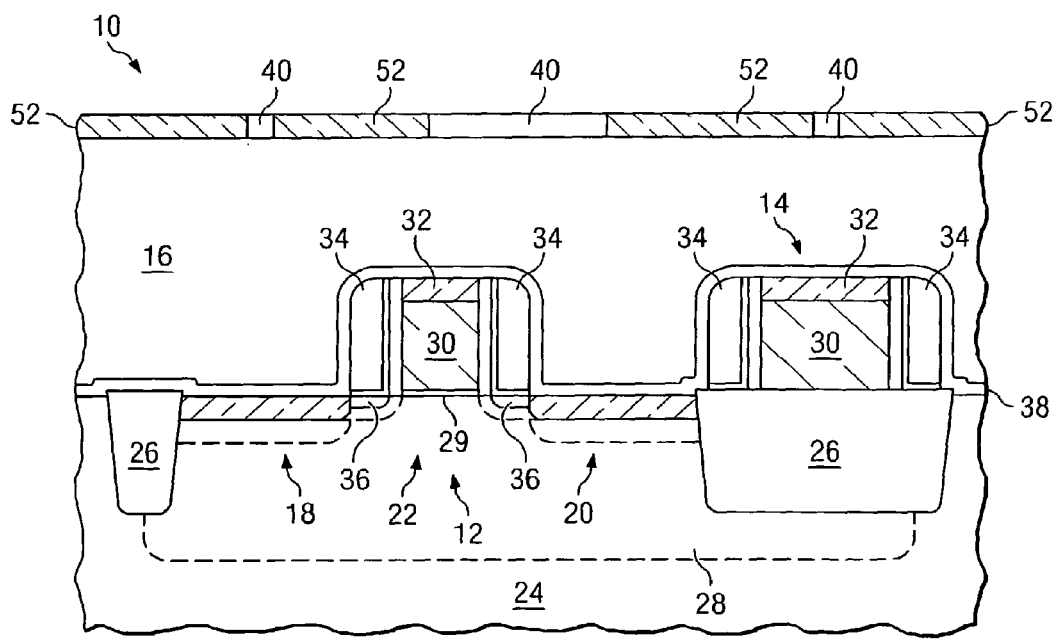

The adjacent portions of metal 50 and silicon 40 can then be reacted as shown in FIG. 8. In the preferred embodiment, the structure is annealed so that the silicon 40 and metal 50 react to form a silicide. Metal 50 overlying the islands 42 will not react and can be stripped away. As shown in FIG. 9, the remaining portions of the pattern transfer layer 42 can then be removed. What remains is number of silicon islands 40 surrounded by silicide 52. (The location of silicon islands 40 is the same as the islands 42 shown in FIG. 6a.)

Figure 10:
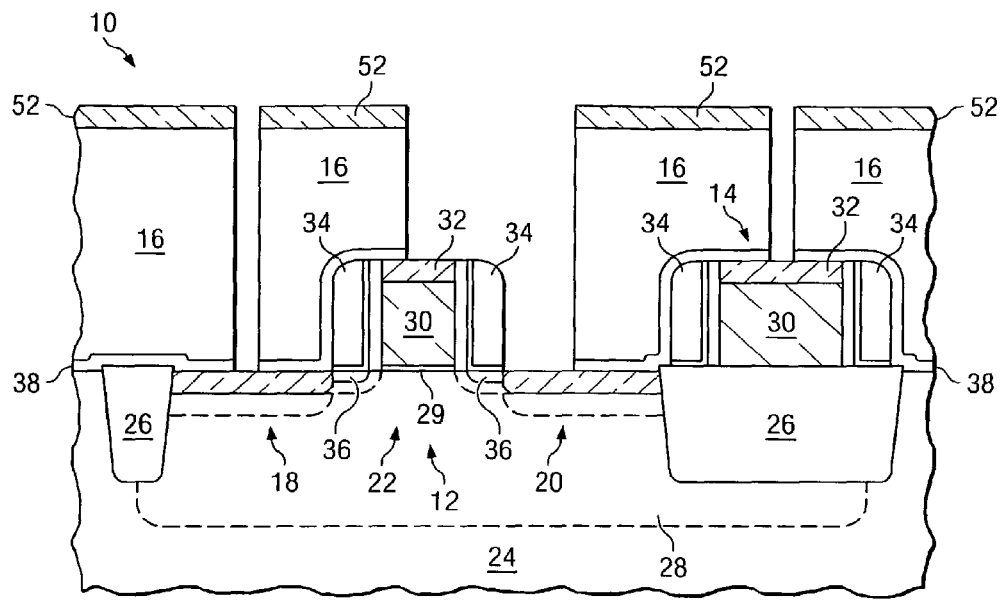

Referring now to FIG. 10, the unreacted portions of the masking layer 40 can then be removed. In one embodiment, these portions are removed by an HF etch. After removal of the unreacted portions, portions of the insulating layer 16 will be exposed. These exposed portions, along with underlying portions of etch stop layer 38, can be removed to form the contact holes. For example, an anisotropic reactive ion etch can be performed using the silicide layer 52 as a hard mask. As but two examples, etching of the masking layer 40, insulator 16 and etch stop layer 38 can be performed in a single etching step (e.g., where chemistries are adjusted for the various layers) or in three distinct etching steps.

The contact holes can then be filled with a conductor to create the conductive plugs. In the preferred embodiment, a liner (not explicitly shown) is first formed along the sidewalls of the contact holes and along the bottom of the contact hole. The liner can be formed from a layer of titanium followed by a layer of titanium nitride. In other embodiments, other liners can be used.

Figure 11:
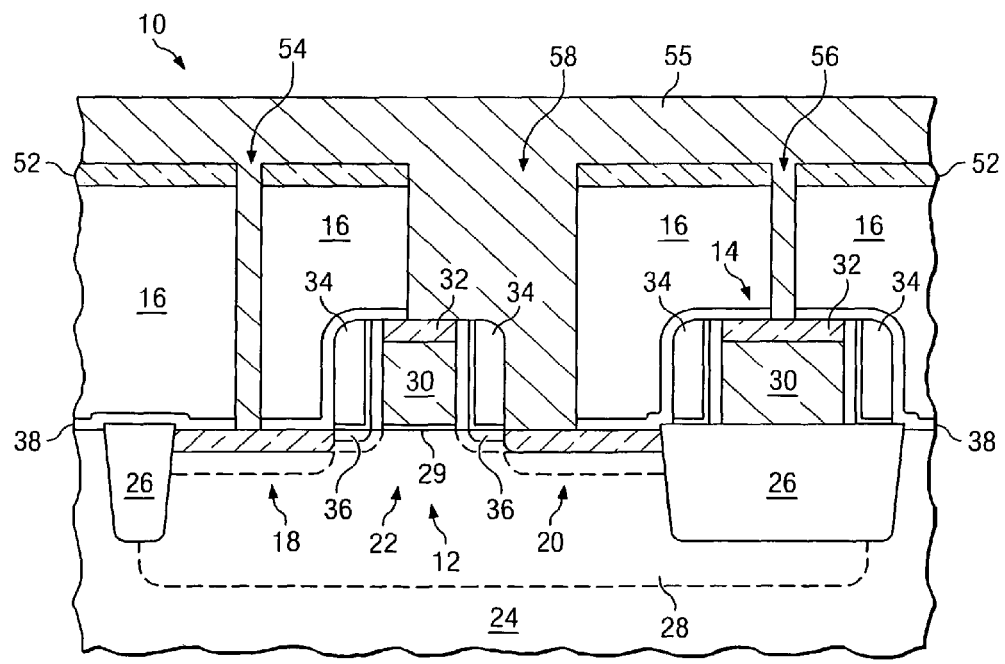
Figure 12:
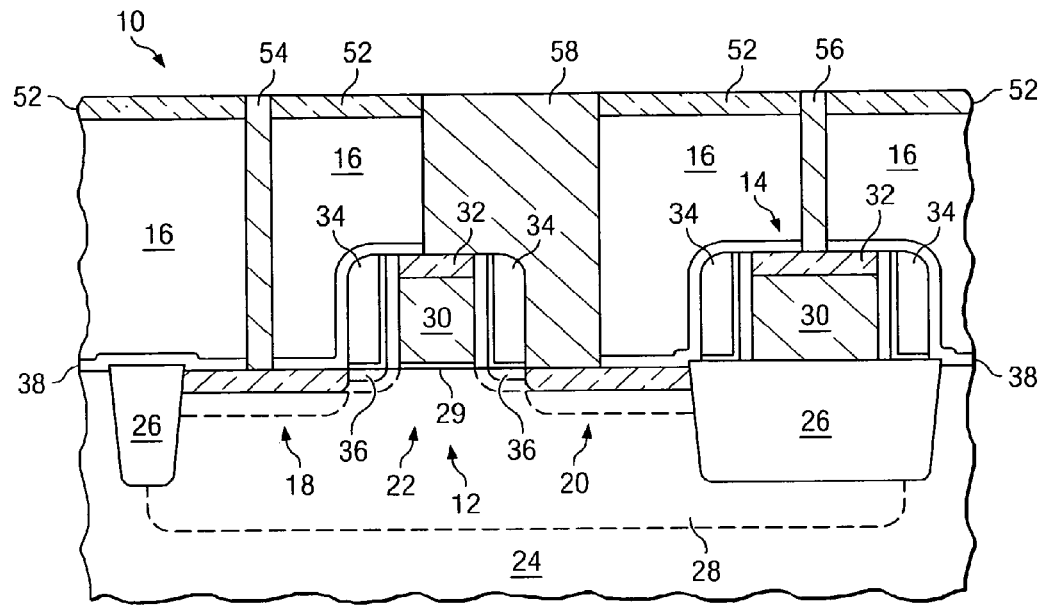

The conductor 54 is preferably tungsten, which can be deposited by chemical vapor deposition. As shown in FIG. 11, the tungsten 55 is preferably formed over the entire structure and then, as shown in FIG. 12, removed from the upper surface of the device. The remaining portions of tungsten form the contacts or plugs 54, 56, 58. In the preferred embodiment, the tungsten is planarized using a chemical mechanical polish process. In an alternate embodiment, the tungsten is etched back, e.g., by performing a reactive ion etch (RIE).

In this particular example, three contacts are illustrated. A contact 54 is electrically connected to the source/drain region 18 and a contact 56 is electrically connected to the interconnect 14. A butted contact 58 is electrically connected to both the gate 30 and the source/drain region 20.

Figure 13:
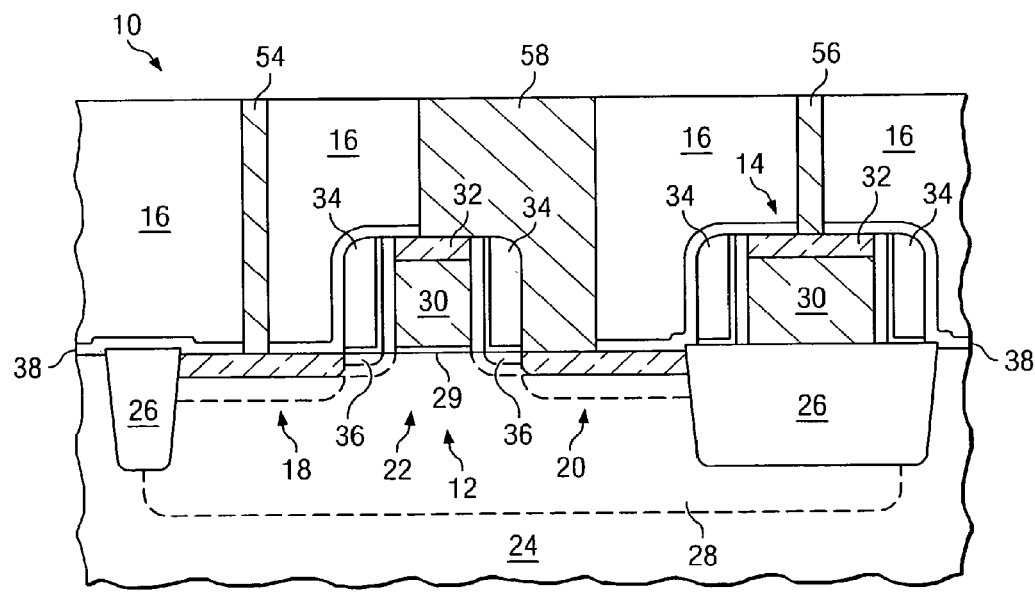

In the structure shown in FIG. 12, the silicide hard mask 52 remains and will electrically short the three contacts 54, 56 and 58. FIG. 13, therefore, shows that this layer can be removed, for example, by an additional etch (e.g., RIE).

Alternatively, the polish step of FIG. 12 can be continued so as to polish through the silicide hard mask 52 as well. In another embodiment, the silicide hard mask could be patterned and etched along with the first level of metallization (not shown). In the preferred embodiment, the first metal layer is formed by a damascene process (e.g., copper damascene) and, as a result, the silicide hard mask would need to be removed before the first interlevel dielectric (not shown) is formed.

A second embodiment method will now be described with respect to FIGS. 14-20. Many of the details discussed above also apply to the second embodiment and, for sake of convenience, will not be repeated herein. Likewise, details discussed with respect to the second embodiment can also be applied to the first.

Figure 14:
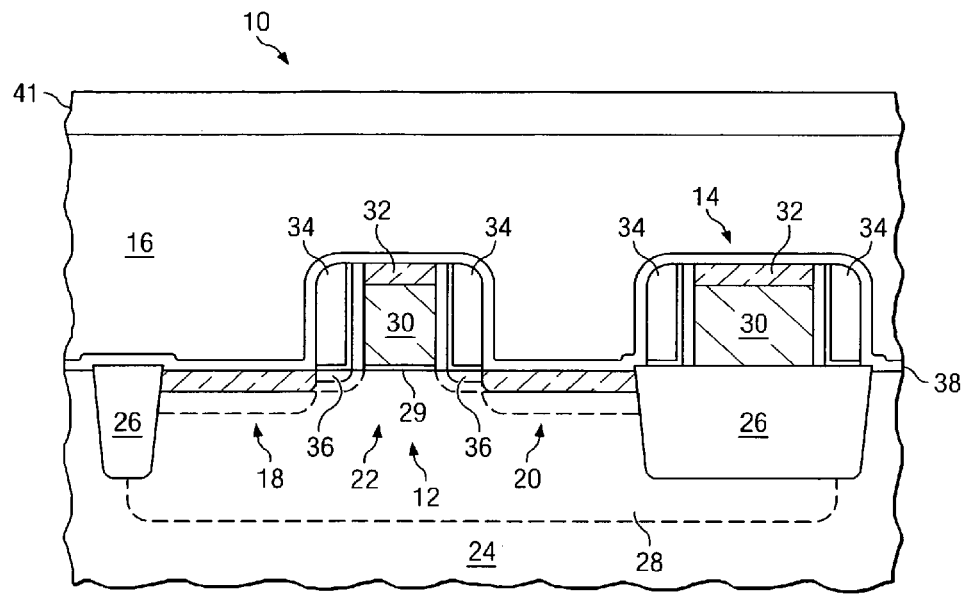
FIGS. 14-20 are cross-sectional diagrams showing various stages of fabrication of a semiconductor device using a second embodiment process.

FIG. 14 begins with the formation of transistor structures as illustrated in FIG. 1 and described above. In this embodiment, a pattern transfer layer 41 is deposited over the inter-level dielectric layer 16. In the preferred embodiment, the pattern transfer layer 41 is a nitride such as silicon nitride (e.g., $Si_3N_4$). In other embodiments, other materials can be used.

Figure 15:
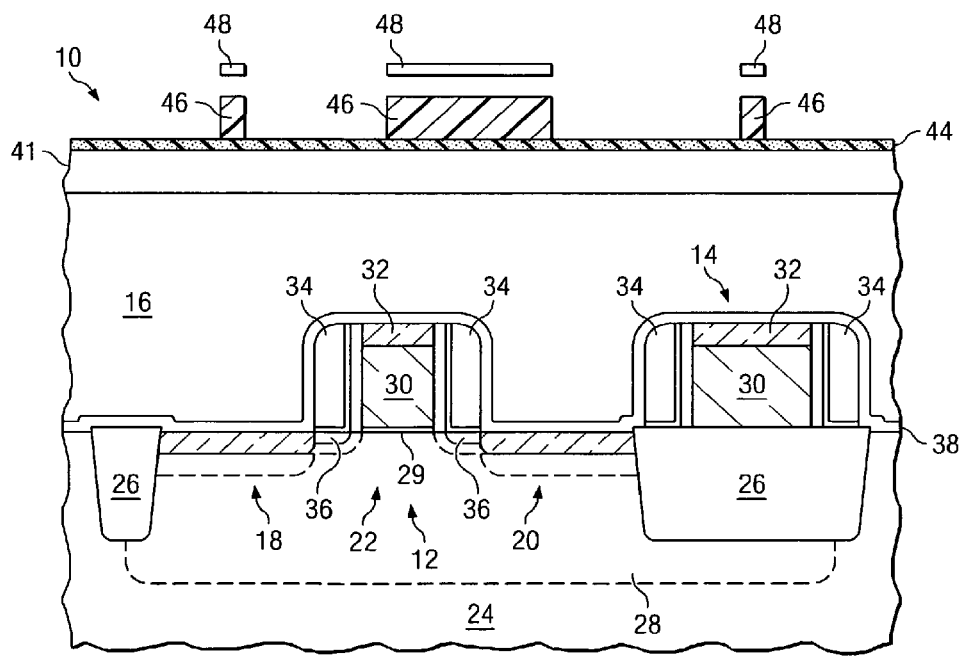

The lithography process is illustrated in FIG. 15. As shown in FIG. 15, an optional antireflective coating (ARC) 44 can be formed over the pattern transfer layer 41 and a resist layer 46 is formed over the ARC 44. Radiation will be applied to the resist through a mask 48 in the pattern of the contact holes to be formed. As before, the photoresist is patterned in a reverse pattern.

Figure 16:
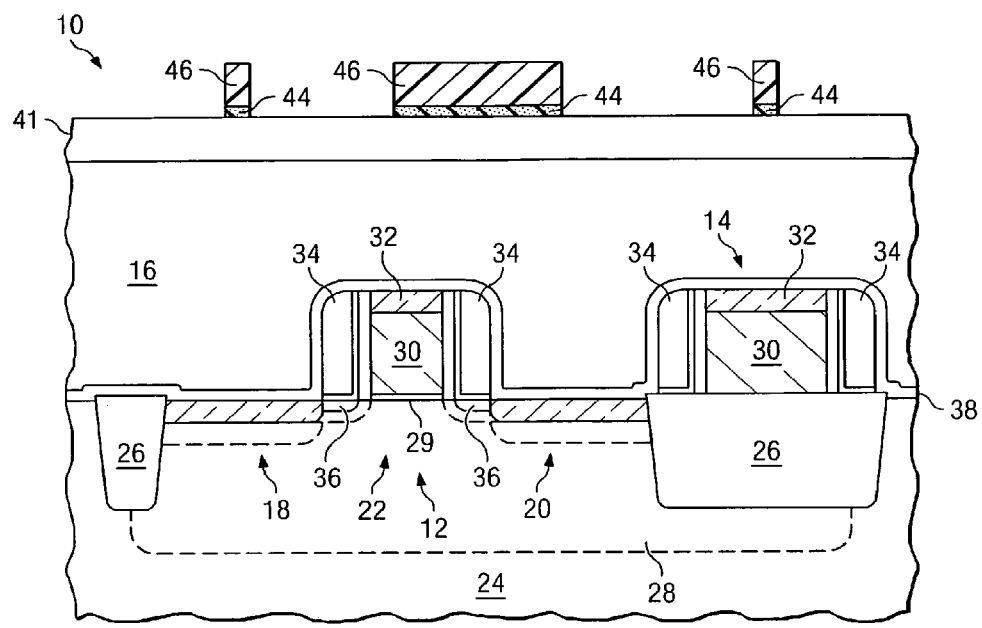
Figure 17:
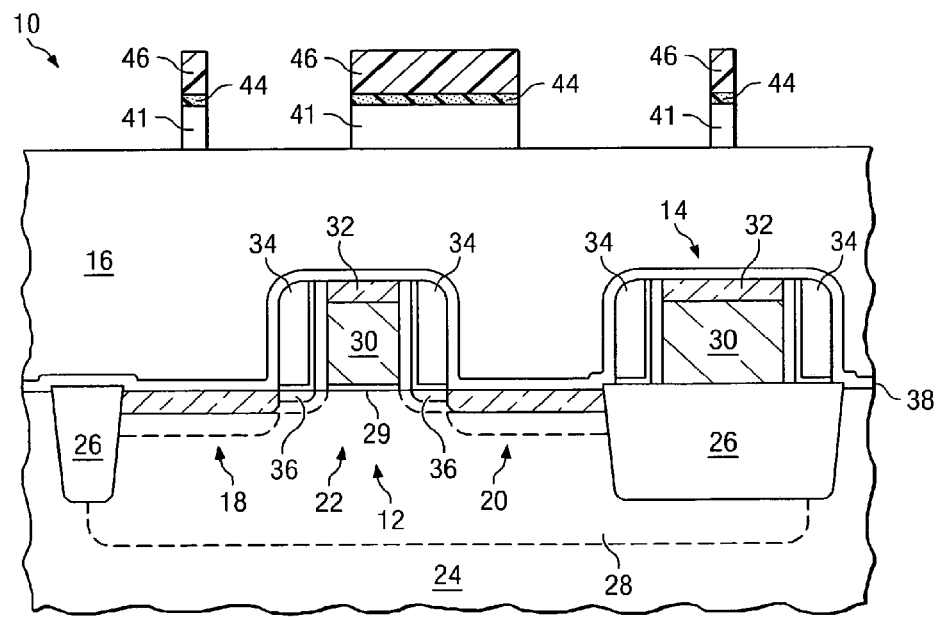

Referring to FIG. 16, the exposed portions of the ARC 44 are removed and the remaining resist islands 46 can be trimmed. As shown in FIG. 17, the pattern transfer layer 41 is etched in alignment with the resist islands 46. During this process, portions of the transfer layer 41 are removed to expose the underlying dielectric layer 16. In other embodiments, an intervening layer could be included. In further embodiments, the pattern transfer layer could be eliminated and the pattern could be transferred in the upper part of the dielectric layer 16 with a certain etch depth (e.g., 100 nm, with timed anisotropic etch process). The remaining portions of the pattern transfer layer 41 remain to overly portions of the insulating layer 16 in which contact holes will be formed.

Figure 18:
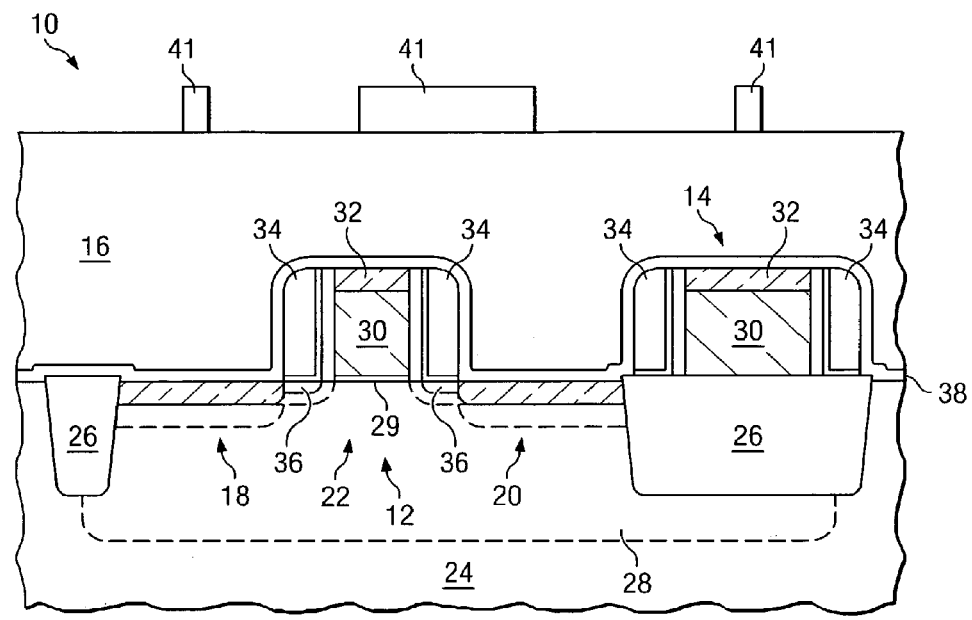

FIG. 18 illustrates a cross-section of the structure after removal of the resist 46 and the ARC 44. The plan view of FIG. 6b can also be used to provide an example of the resulting structure.

Figure 19:
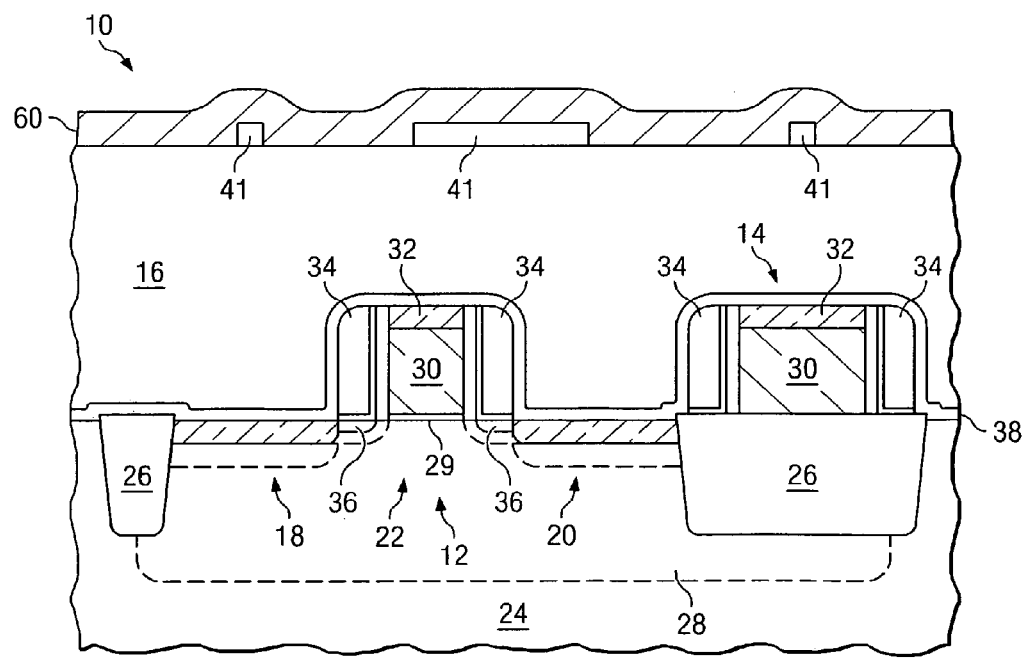

Referring now to FIG. 19, a masking layer 60 is deposited over the structure. The masking layer 60 substantially fills the openings between the remaining portions of the pattern transfer layer 41 and, in this example, also overlies the portions of layer 41. In an alternate embodiment, the masking layer 60 can be selectively deposited so that material fills the openings only without covering the islands. This selective deposition process would eliminate the polish step described below with respect to FIG. 20.

In the preferred embodiment, the masking layer 60 is formed from tungsten. For example, tungsten can be deposited using a chemical vapor deposition process. Although not shown, adhesion layer such as Ti, TiN, TiW, Ta, TaN, or combinations thereof, can be formed before depositing the tungsten. Long term reliability is not an issue since the masking layer 60 is a sacrificial mask (at least in the example where a conductor is used) and will be removed. Other materials can also be used as the masking layer. For example, the masking layer could be Si, Cu, Ti, TiN, Ti/TiN, TiW, Ta, TaN or combinations thereof. In general, any material can be used so long as the pattern transfer layer 41 and the dielectric layer 16 can be etched selectively with respect to that material.

Figure 20:
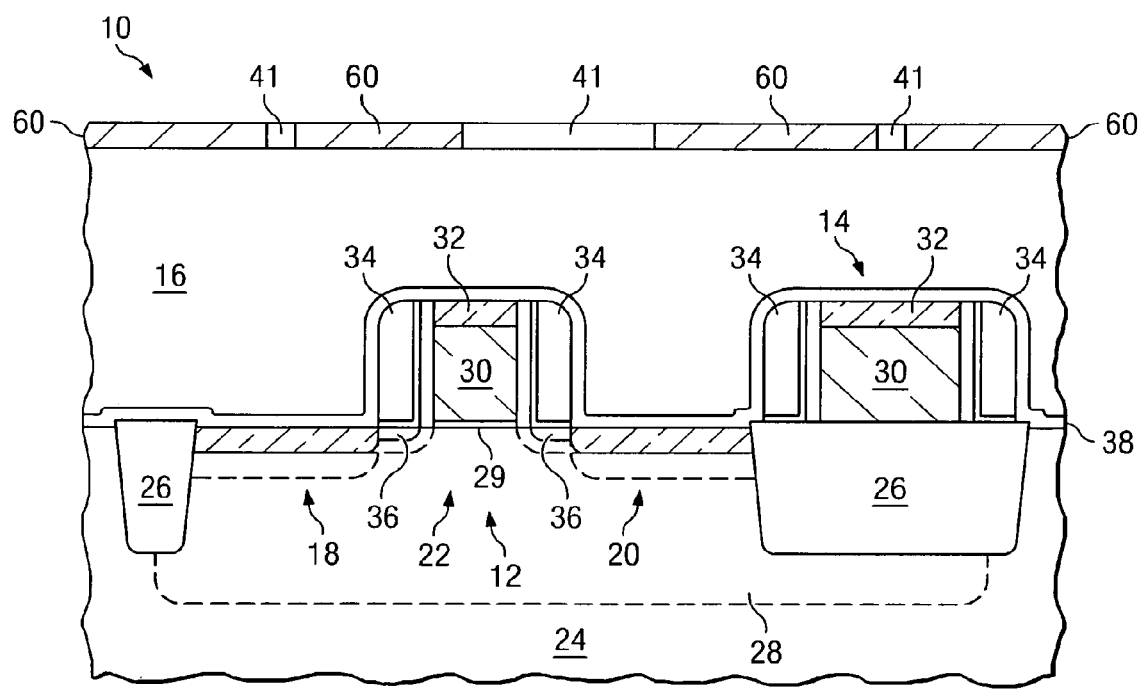

FIG. 20 illustrates the structure of FIG. 19 after the performance of a chemical mechanical polish (CMP) process. During this process, any portions of the masking layer 60 overlying the pattern transfer layer 41 are removed. The resulting structure is similar to that shown in FIG. 9, with the silicide 52 being replaced by the masking material 60. As such, the process can continue from this point as described above.

The present invention has been described above with respect to forming contact holes for connection of transistors and other underlying structures. Concepts of the invention could also be applied to back end of line (BEOL) processes. For example, the contact holes 54, 56, 58 could be vias between metallization lines (e.g., in a single damascene process). Alternatively, the process could be used to define the trenches in metallization layers, e.g., in a damascene process. For example, the invention could be useful when the spaces between conductors are larger than the width of the conductors.

Various embodiments of the invention have a number of advantages. For example, the lithography process window is not limited by the necessity of printing holes. In addition, conventional PMD fills are maintained since the re-inverting is accomplished by a hard mask over the PMD. As another advantage, the present invention does not require integration of any "exotic" materials (although such materials can be used). The transfer layer and hard mask can be formed from materials used in conventional contact modules.

As another advantage, embodiments of the invention provide an option to trim the lithography features with an ARC and/or hard mask etch process. As a result, the lithography requirements can be further relaxed. In another embodiment, the lithography features can be trimmed by salicide growth.

In various embodiments, the hard mask and transfer layers can be made very thin because no additional CMP steps are required. In addition, the hard mask can be removed by conventional process steps. These features serve to simplify the process and thus reduce costs.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a semiconductor device, the method comprising:
    after forming a gate and a source/drain region of a transistor, forming an etch stop layer over a conductive region;
    forming an insulating layer over the etch stop layer;
    forming a pattern transfer layer adjacent an upper portion of the insulating layer, the pattern transfer layer being patterned in the reverse tone of a layout of recesses to be formed in the insulating layer such that the pattern transfer layer remains over regions where the recesses are to be formed;
    forming a conductive mask material over the insulating layer, the conductive mask material being self-aligned with the pattern transfer layer, wherein forming a conductive mask material comprises:
        depositing a layer of the conductive mask material, and
        performing a chemical mechanical polish step to remove any conductive mask material from over portions of the pattern transfer layer;
    removing remaining portions of the pattern transfer layer; and
    forming a contact hole having continuously vertical sidewalls by etching recesses in the insulating layer using the conductive mask material as a mask.

2. The method of claim 1, wherein forming a pattern transfer layer comprises depositing a layer over the insulating layer and etching the deposited layer.

3. The method of claim 2, wherein depositing a layer comprises depositing a silicon nitride layer.

4. The method of claim 1, wherein forming a pattern transfer layer comprises etching an upper portion of the insulating layer.

5. The method of claim 1, wherein the conductive mask material comprises tungsten.

6. The method of claim 1, further comprising filling the contact hole with a conductive material.

7. The method of claim 6, further comprising removing the conductive mask material after filling the contact hole with the conductive material.

8. The method of claim 1, wherein the conductive region comprises doped silicon.

9. The method of claim 1, wherein the conductive region comprises a metal.

10. The method of claim 1, further comprising:
forming a resist layer separate and distinct from and over said pattern transfer layer; and
removing portions of the resist layer so as to leave resist on said pattern transfer layer according to a selected pattern, the resist layer being patterned in the reverse tone of the layout of recesses to be formed in the insulating layer such that the resist layer remains over regions where the recesses are to be formed.

11. The method of claim 1, wherein forming a contact hole comprises etching through the insulating layer and the etch stop layer.

12. A method of forming a semiconductor device, the method comprising:
forming a transistor having a gate and a source/drain region in a semiconductor body;
forming an insulating layer over the semiconductor body including over the transistor;
depositing a pattern transfer layer over the insulating layer;
depositing a antireflective coating (ARC) layer over the pattern transfer layer;
forming a resist layer over the ARC layer;
patterning the resist layer and the ARC layer to expose portions of the pattern transfer layer;
removing the exposed portions of the pattern transfer layer to expose portions of the insulating layer;
forming a conductive masking layer over the exposed portions of the insulating layer;
removing remaining portions of the pattern transfer layer;
etching a contact hole in the insulating layer using the conductive masking layer as a mask;
filling the contact hole with a conductor, the conductor being electrically coupled to the transistor, wherein filling the contact hole comprises forming a butted contact that electrically couples both the gate and the source/drain region; and
removing the conductive masking layer, wherein removing the conductive masking layer comprises performing a chemical mechanical polish or a reactive ion etch.

13. The method of claim 12, wherein depositing the conductive masking layer comprises depositing tungsten.

14. The method of claim 12, wherein the conductive masking layer is removed before forming the conductor in the contact hole.

15. The method of claim 12, wherein the conductive masking layer is removed after forming the conductor in the contact hole.

16. The method of claim 12, wherein the conductor comprises tungsten.

17. The method of claim 16, further comprising forming a conductive liner in the contact hole before filling the contact hole with the conductor.

18. The method of claim 17, wherein the conductive liner comprises a layer of titanium nitride overlying a layer of titanium.

19. The method of claim 12, wherein the butted contact physically contacts a first silicide region on the gate and a second silicide region on the source/drain region.

20. A method of forming a semiconductor device, the method comprising:
forming a transistor having a gate and a source/drain region in a semiconductor body;
forming an etch stop layer over the semiconductor body including over the transistor;
forming a blanket insulating layer over the etch stop layer;
depositing a pattern transfer layer over the insulating layer;
depositing a antireflective coating (ARC) layer over the pattern transfer layer;
forming a resist layer over the ARC layer;
patterning the resist layer and the ARC layer to expose portions of the pattern transfer layer;
removing the exposed portions of the pattern transfer layer to expose portions of the insulating layer;
forming a conductive masking layer over the exposed portions of the insulating layer;
removing remaining portions of the pattern transfer layer;
etching a contact hole in the blanket insulating layer using the conductive masking layer as a mask;
filling the contact hole with a conductor, the conductor being electrically coupled to the transistor; and
removing the conductive masking layer, wherein removing the conductive masking layer comprises performing a chemical mechanical polish or a reactive ion etch.

21. The method of claim 20, wherein filling the contact hole comprises forming a butted contact that electrically couples both the gate and the source/drain region.

22. The method of claim 20, wherein removing remaining portions of the pattern transfer layer and etching a contact hole comprising etching through the insulating layer and the etch stop layer are performed in a single etching step.

* * * * *